US011948966B2

(12) United States Patent
Varghese et al.

(10) Patent No.: US 11,948,966 B2
(45) Date of Patent: Apr. 2, 2024

(54) RADIATION EMITTING SEMICONDUCTOR CHIP AND RADIATION EMITTING SEMICONDUCTOR DEVICE

(71) Applicant: OSRAM Opto Semiconductors GmbH, Regensburg (DE)

(72) Inventors: Tansen Varghese, Regensburg (DE); Bruno Jentzsch, Regensburg (DE)

(73) Assignee: OSRAM Opto Semiconductors GmbH, Regensburg (DE)

( * ) Notice: Subject to any disclaimer, the term of this patent is extended or adjusted under 35 U.S.C. 154(b) by 397 days.

(21) Appl. No.: 17/434,511

(22) PCT Filed: Mar. 4, 2020

(86) PCT No.: PCT/EP2020/055693
§ 371 (c)(1),
(2) Date: Aug. 27, 2021

(87) PCT Pub. No.: WO2020/187570
PCT Pub. Date: Sep. 24, 2020

(65) Prior Publication Data
US 2022/0130893 A1 Apr. 28, 2022

(30) Foreign Application Priority Data
Mar. 18, 2019 (DE) .......................... 102019106805.3

(51) Int. Cl.
*H01L 27/15* (2006.01)
*H01L 33/00* (2010.01)
(Continued)

(52) U.S. Cl.
CPC ........ *H01L 27/156* (2013.01); *H01L 33/0045* (2013.01); *H01S 5/0239* (2021.01); *H01S 5/18* (2013.01)

(58) Field of Classification Search
None
See application file for complete search history.

(56) References Cited

U.S. PATENT DOCUMENTS

| 4,942,366 A | 7/1990 | Toda |
| 6,172,787 B1 | 1/2001 | Naiki |

(Continued)

FOREIGN PATENT DOCUMENTS

| CN | 102308140 A | 1/2012 |
| CN | 106796969 A | 5/2017 |

(Continued)

OTHER PUBLICATIONS

Ressetti, M. et al., "RGB Superluminescent Diodes for AR Micro-Displays," SID Digest, May 30, 2018, pp. 17-20.

*Primary Examiner* — Bilkis Jahan
(74) *Attorney, Agent, or Firm* — Slater Matsil, LLP

(57) ABSTRACT

In an embodiment a radiation emitting semiconductor chip includes a semiconductor layer sequence with a plurality of active regions and a main extension plane, wherein each active region has a main extension direction, wherein each active region is configured to emit electromagnetic radiation from an emitter region extending parallel to the main extension plane, wherein at least two active regions overlap in plan view, wherein the emitter regions are arranged at grid points of a regular grid connected by at least one grid line, and wherein the main extension direction of at least one active region encloses an angle of at least 10° and at most 80° with the grid lines of the regular grid.

19 Claims, 3 Drawing Sheets

(51) Int. Cl.
    *H01S 5/0239*     (2021.01)
    *H01S 5/18*     (2021.01)

(56) References Cited

U.S. PATENT DOCUMENTS

| | | |
|---|---|---|
| 9,115,852 B2 | 8/2015 | Hofmann et al. |
| 9,282,851 B2 | 3/2016 | Cochran et al. |
| 10,355,170 B2 | 7/2019 | Weiss |
| 10,985,528 B2 | 4/2021 | Gerhard |
| 11,557,879 B2 | 1/2023 | Joseph |
| 2005/0180482 A1* | 8/2005 | Osowski .................. H01S 5/42 372/50.124 |
| 2008/0111471 A1 | 5/2008 | Blumel et al. |
| 2008/0198890 A1* | 8/2008 | Ungar ...................... H01S 5/18 372/50.1 |
| 2010/0127431 A1 | 5/2010 | Sandstrom |
| 2011/0002675 A1 | 1/2011 | Cochran et al. |
| 2016/0233390 A1* | 8/2016 | Hayashi ................ H01L 33/486 |

FOREIGN PATENT DOCUMENTS

| | | | |
|---|---|---|---|
| CN | 108141005 A | 6/2018 | |
| CN | 109309340 A | 2/2019 | |
| DE | 102008061152 A1 | 6/2010 | |
| JP | H09281420 A | 10/1997 | |
| WO | 2010102263 A1 | 9/2010 | |
| WO | WO 2010/102263 | * 9/2010 | ............... H01S 5/00 |

* cited by examiner

RADIATION EMITTING SEMICONDUCTOR CHIP AND RADIATION EMITTING SEMICONDUCTOR DEVICE

This patent application is a national phase filing under section 371 of PCT/EP2020/055693, filed Mar. 4, 2020, which claims the priority of German patent application 102019106805.3, filed Mar. 18, 2019, each of which is incorporated herein by reference in its entirety.

A radiation emitting semiconductor chip is specified. In addition, a radiation emitting semiconductor device is specified.

SUMMARY

Embodiments provide a radiation emitting semiconductor chip, which is particularly efficient. Further embodiments provide a radiation emitting semiconductor device with such a semiconductor chip.

According to at least one embodiment, the radiation emitting semiconductor chip comprises a semiconductor layer sequence with a plurality of active regions and a main extension plane. Particularly preferably, the semiconductor layer sequence is epitaxially grown. Preferably, the radiation emitting semiconductor chip is configured to generate near-ultraviolet radiation, visible light and/or near-infrared radiation during operation. The visible light can be, for example, light of blue, green, yellow or red colour.

The semiconductor layer sequence is preferably based on a compound semiconductor material. If the radiation emitting semiconductor chip is configured to emit, for example, light of red colour, the semiconductor layer sequence is preferably based on a III-V compound semiconductor material. The III-V compound semiconductor material is, for example, a phosphide and/or arsenide compound semiconductor material. The III-V compound semiconductor material then comprises, for example, AlGaInP and/or AlGaAs.

If the radiation emitting semiconductor chip is configured to emit, for example, light of blue or green colour, the semiconductor layer sequence is preferably based on a III-N compound semiconductor material. The III-N compound semiconductor material is, for example, a nitride compound semiconductor material. The III-N compound semiconductor material then comprises, for example, InGaN and AlGaN.

The semiconductor layer sequence can have dopants as well as additional components. For the sake of simplicity, however, only the essential constituents of the crystal lattice of the semiconductor layer sequence, i.e. Al, Ga, In, N, As or P, are indicated, even if these can be partially replaced and/or supplemented by small amounts of further substances.

The semiconductor layer sequence preferably extends along the main extension plane. A lateral direction is preferably oriented parallel to the main extension plane. A vertical direction is preferably oriented perpendicular to the lateral direction.

The active regions are preferably arranged spaced apart to one another in the lateral direction. In this case, the active regions are preferably not in direct contact with one another at any point of the semiconductor chip. Furthermore, the active regions can be arranged in a common plane, for example, so that the active regions are formed without overlapping in plan view.

Alternatively, it is possible that at least two of the active regions are in direct contact with one another. In this case, at least two active regions are preferably overlapping in plan view. In this case, the overlapping active regions can be spaced apart from the remaining overlapping and/or non-overlapping active regions in the lateral direction.

According to at least one embodiment, each active region has a main extension direction. The main extension direction extends along a respective length of an active region. The length of an active region preferably corresponds to a largest extension of a cross-sectional area of the active region parallel to the main extension plane. Furthermore, the active regions each have a width that is perpendicular to the main extension direction. The width of an active region corresponds to a smallest extension of the cross-sectional area of an active region in a direction parallel to the main extension plane.

Preferably, the active regions are formed straight. That is to say that side surfaces of the active regions preferably extend parallel to the main extension direction. Alternatively, the active regions can be curved. In this case, the side surfaces of the active regions preferably extend curved to the main extension direction.

The width in lateral direction of each active region is preferably between at least 0.2 micrometres and at most 50 micrometres, more preferably between at least 3 micrometres and at most 7 micrometres. The length in lateral direction of each active region is preferably between at least 50 micrometres and at most 1000 micrometres, more preferably between at least 80 micrometres and at most 100 micrometres.

According to at least one embodiment, each active region emits electromagnetic radiation during operation from an emitter region extending parallel to the main extension plane. Preferably, the emitter regions are each arranged along a main extension direction in a first edge region of an active region.

Preferably, the emitter regions are separated from one another by non-emissive regions. Preferably, the non-emitting regions are arranged between directly adjacent emitter regions in plan view. The non-emitting regions emit comparatively little or no radiation compared to the emitter regions. Preferably, the non-emitting regions emit 99% less radiation than the emitter regions.

The radiation emitting semiconductor chip preferably comprises a carrier. The semiconductor layer sequence is preferably arranged on the carrier with a bottom surface opposite the emitter regions. The carrier is preferably provided and configured to mechanically stabilise the semiconductor chip. The carrier is preferably electrically conductive. The carrier thus preferably comprises a metal or is formed from a metal. For example, the carrier is galvanically deposited. Advantageously, heat dissipation of heat occurring in the active regions can be achieved particularly effectively in this way.

Alternatively, it is also possible that the carrier comprises a semiconductor material and/or a dielectric material or consists of a semiconductor material and/or a dielectric material. For example, the semiconductor material is silicon and the dielectric material is AlN.

According to at least one embodiment, the emitter regions are arranged at grid points of a regular grid connected by at least one grid line. The regular grid can preferably be a polygonal grid. The grid lines preferably extend parallel to the main extension plane.

The regular grid is preferably a two-dimensional grid. Alternatively, the regular grid can be a one-dimensional grid. In this case, the grid points of the regular grid are arranged along a line. The grid points are preferably arranged at equidistant distances from one another on the line. Alternatively, it is possible for directly adjacent grid points to be spaced at different distances. The line can be a straight line or a curved line.

For example, if the regular grid is an orthogonal grid, the grid can be a square grid. In this case, the regular grid has first grid lines and second grid lines, wherein the first grid lines extend parallel to one another and the second grid lines extend parallel to one another. Furthermore, the first grid lines are preferably arranged orthogonally to the second grid lines.

According to at least one embodiment, the main extension direction of at least one active region encloses an angle of at least 10° and at most 80° with the grid lines of the regular grid. That is to say that the main extension directions of the active regions are preferably not parallel to the at least one grid line of the regular grid.

An apex of the angle is arranged in each case in an emitter region. The legs of the angle are formed by a part of the main extension direction and a part of the grid line adjacent to the emitter region. The parts of the main extension direction and the grid line forming the angle generally extend in a lateral direction facing away from the emitter region.

According to a preferred embodiment, the radiation emitting semiconductor chip comprises a semiconductor layer sequence having a plurality of active regions and a main extension plane, each active region having a main extension plane. In addition, each active region, during operation, emits electromagnetic radiation from an emitter region parallel to the main extension plane. The emitter regions are arranged at grid points of a regular grid connected by at least one grid line. Finally, in this embodiment, the main extension direction of at least one active region encloses an angle of at least 10° and at most 80° with the grid lines of the regular grid.

According to at least one embodiment, the emitter regions are arranged along columns and rows. For example, if the regular grid is a two-dimensional orthogonal grid, the rows preferably extend along first grid lines. The columns preferably extend along second grid lines. Preferably, the main extension directions of the active regions each enclose a first angle of at least 45° and at most 80° with the first grid lines. The main extension directions of the active regions each enclose a second angle of at least 10° and at most 45° with the second grid lines. Preferably, the first angle and the second angle together result in approximately 90°. "Approximately" in this context means in particular that the first angle and the second angle together result in at least 75° and at most 105°.

In a side view along the rows, the active regions of a row can be formed completely overlapping. Furthermore, active regions of directly adjacent rows can preferably partially overlap in a side view along the rows. Due to the partial overlapping of the active regions of directly adjacent rows, a density of the emitter regions per unit area can advantageously be particularly high.

In a side view along the columns, the active regions of a column can be formed completely overlapping. The active regions of directly adjacent columns can preferably not overlap in a side view along the columns. Advantageously, the semiconductor chip can thus be separated into semiconductor chip bars along columns, for example. The bars produced with the active regions of a column can thus advantageously be stacked in the lateral direction.

According to at least one embodiment, the main extension directions of the active regions in at least one row enclose equal angles with the grid lines of the regular grid. Furthermore, the main extension directions of the active regions in at least one column can include equal angles with the grid lines of the regular grid.

Preferably, the main extension directions of the active regions of each row can enclose equal angles with the grid lines of the regular grid. In this case, the main extension directions of the active regions in each column also enclose equal angles with the grid lines of the regular grid. Thus, all main extension directions of the active regions are preferably arranged parallel to one another.

According to at least one embodiment, the main extension directions of the active regions of different rows enclose different angles with the grid lines of the regular grid. Furthermore, the main extension directions of the active regions of different columns can include different angles with the grid lines of the regular grid.

According to at least one embodiment, the main extension directions of the active regions in at least one row include different angles with the grid lines of the regular grid. Further, the main extension directions of the active regions in at least one column can include different angles with the grid lines of the regular grid.

Furthermore, it is possible that the main extension directions of the active regions in different rows include different angles with the grid lines of the regular grid and that the main extension directions of the active regions in the same rows include different angles with the grid lines of the regular grid. Thus, the main extension directions of the active regions can be arranged in a circular shape, for example, in plan view. Further, such circular arrangements can overlap in plan view.

According to at least one embodiment, at least two active regions overlap in plan view. The portion of the overlapping active regions in plan view forms a common active region of the at least two overlapping active regions. Preferably, at least two active regions of a common row overlap with one another in plan view. Furthermore, it is possible that at least two active regions of a common column overlap with one another in plan view. Further, at least two active regions in a common row may overlap with one another in plan view, and the overlapping active regions can each overlap with at least one active region of a directly adjacent row in plan view.

For example, if the at least two active regions are formed overlapping, the overlapping region can be spaced apart from the emitter regions of the at least two active regions in the lateral direction. For example, the overlapping region is arranged in a centre of the active regions in plan view.

Advantageously, the overlapping of the active regions in plan view allows a particularly large number of active regions to be arranged per unit area. Thus, a density of the emitter regions per unit area can advantageously be particularly large.

According to at least one embodiment, a first reflective surface is arranged in a first edge region of each active region, the first reflective surface encloses an angle of at least 35° and at most 55° with the main extension plane. Preferably, the first reflective surface in the first edge region includes an angle of at least 40° and at most 50° with the main extension plane. Particularly preferably, the angle between the first reflective surface and the main extension plane is about 45°.

The first reflective surface preferably has a reflectivity for the electromagnetic radiation of at least 90%, in particular 95%, 99% or 100%.

The first reflective surface is preferably electrically insulating and comprises, for example, dielectric materials or consists thereof. For example, the first reflective surface is a Bragg mirror comprising alternating layers of a high refractive index material and a low refractive index material.

Furthermore, the first reflective surface can be a combination of metallic materials and electrically insulating materials. An interface between the first reflective surface and the semiconductor layer sequence is here preferably electrically insulating.

According to at least one embodiment, the first edge regions of at least two directly adjacent emitter regions overlap in a row in plan view. It is possible that the first reflective surfaces of at least two directly adjacent emitter regions are directly adjacent to one another in the overlapping portion of the two active regions. Preferably, the first edge regions of at least two directly adjacent emitter regions completely overlap with one another in the overlapping area.

Advantageously, a light coupling out efficiency and a radiation pattern of the radiation emitting semiconductor chip is thus improved, since the emitted radiation of the active regions is coupled out via the overlapping emitter regions and can be superimposed in a far field.

In this embodiment, the first reflective surfaces in the overlapping first edge regions can preferably have an angle to a main extension plane different from 45° but between at least 35° and at most 55°. Preferably, the angles of the reflective surfaces are configured to be of different sizes here. Since the emitted electromagnetic radiation of the active regions is superimposed in the overlapping emitter regions, the angles of the reflective surfaces different from 45° can be compensated and a common spectrum of the radiation powers advantageously has only one main peak.

According to at least one embodiment, a second reflective surface is arranged in a second edge region of each active region opposite to the first edge region. The second reflective surface is preferably electrically insulating and comprises or consists of, for example, dielectric materials. For example, the second reflective surface is a Bragg mirror comprising alternating layers of a high refractive index material and a low refractive index material.

Furthermore, the second reflective surface can be a combination of metallic materials and electrically insulating materials. An interface between the second reflective surface and the semiconductor layer sequence is preferably electrically insulating.

The second reflective surface preferably has a reflectivity for electromagnetic radiation of at least 90%, in particular 95%, 99% or 100%.

According to at least one embodiment, the second reflective surface encloses an angle of at least 35° and at most 55° with the main extension plane. Preferably, the second reflective surface in the second edge region encloses an angle of at least 40° and at most 50° with the main extension plane. Particularly preferably, the angle between the second reflective surface and the main extension plane is 45°.

According to at least one embodiment, the second reflective surfaces are each perpendicular to the main extension plane. Preferably, the second reflective surfaces each have a deviation of at most 2° from the vertical direction.

According to at least one embodiment, each active region comprises an anti-reflective coating arranged on the semiconductor layer sequence in the first edge region. The anti-reflective coating is preferably arranged on the top surface of the semiconductor layer sequence and can be in direct contact therewith. Preferably, the anti-reflective coating overlaps with the emitter region in each case. Particularly preferably, the anti-reflective coating overlaps completely with the emitter region.

A reflection at the interface from the top surface of the semiconductor layer sequence to the anti-reflective coating is, for example, at most 1%, at most 0.0001% or at most 0.00001%.

According to at least one embodiment, each active region comprises a reflective coating arranged on the semiconductor layer sequence in the second edge region. Preferably, the reflective coating is arranged on the top surface of the semiconductor layer sequence and can be in direct contact therewith. The reflective coating preferably has a reflectivity of at least 90%, at least 95% or at least 99% for the electromagnetic radiation generated by the active regions. Thus, the reflective coating can be a highly reflective coating.

If the second reflective surfaces are each perpendicular to the main extension plane, the top surface of the semiconductor layer sequence is preferably free of the reflective coating. Particularly preferably, the radiation emitting semiconductor chip in this case has no reflective coating.

Alternatively, it is possible that each active region is free of a reflective coating and/or each active region is free of an anti-reflective coating.

According to at least one embodiment, each active region comprises a first contact layer arranged on the top surface of the semiconductor layer sequence. The first contact layers are preferably electrically conductive and are provided and configured for electrically contacting the semiconductor layer sequence. The first contact layers are preferably arranged in regions on the top surface of the semiconductor layer sequence.

The first contact layers are preferably arranged spaced apart from one another in the lateral direction on the top surface of the semiconductor layer sequence. Furthermore, the first contact layers each have a width and a length.

According to one embodiment, a first contact layer is arranged on the top surface of the semiconductor layer sequence. The first contact layer is preferably formed continuously and covers a major part of the top surface of the semiconductor layer sequence. The first contact layer preferably does not cover the first edge regions and/or second edge regions. The first contact layer preferably covers at least 80% or at least 90% of the semiconductor layer sequence. The first contact layer preferably comprises or consists of a metal. Further, first contact layers can comprise a plurality of individual layers.

The first contact layer can further comprise or be formed from a transparent conductive oxide. Transparent conductive oxides ("TCO") are transparent electrically conductive materials, typically metal oxides, such as zinc oxide, tin oxide, aluminium tin oxide, cadmium oxide, titanium oxide, indium oxide and indium tin oxide (ITO).

According to at least one embodiment, each active region comprises a second contact layer arranged on a bottom surface of the semiconductor layer sequence. The second contact layers are preferably electrically conductive and are provided and configured for electrically contacting the semiconductor layer sequence. The second contact layers are preferably arranged in regions on the bottom surface of the semiconductor layer sequence. The second contact layers are preferably arranged spaced apart from one another in the lateral direction on the bottom surface of the semiconductor layer sequence. Furthermore, the second contact layers each have a width and a length.

The second contact layers preferably comprise or consist of a metal. Further, the second contact layers can comprise a plurality of individual layers. Further, the first contact layers can comprise or be formed from a transparent conductive oxide.

For example, the metal of the first contact layers and/or the metal of the second contact layers is Ti, Pt, Ag and/or Au.

According to at least one embodiment, the first contact layers and the second contact layers predetermine lateral dimensions of an active zone of each active region.

Preferably, each active region comprises a first contact layer and a second contact layer opposite one another. Preferably, the second contact layer and the first contact layer of each active region overlap with one another in plan view. In the overlapping regions, a current density of the current to be introduced is comparatively high. Preferably, in the overlapping regions, the current density is such that the active region emits electromagnetic radiation and thus comprises the active zones. Preferably, the active zone has a larger area than a first contact layer or second contact layer by which the active zone is predetermined.

If the active regions are formed overlapping, the first contact layers of the overlapping active regions also overlap with one another in plan view. Furthermore, the second contact layers can also overlap with one another there in plan view.

If the active regions are formed without overlapping, the active regions and the active zones can preferably be controlled individually and separately from one another. If at least two active regions overlap with one another, the overlapping active regions are preferably controllable together. Alternatively, it is possible that the first contact layers and/or the second contact layers of the overlapping active regions do not overlap with one another in plan view. In this case, the overlapping active regions are preferably separately controllable.

According to one embodiment, the semiconductor layer sequence in the active regions can comprise a ridge waveguide each. Each ridge waveguide is preferably formed by a protrusion comprising a portion of the semiconductor layer sequence. A width of the ridge waveguide aligned perpendicular to the main extension direction of the active regions preferably predetermines the width of the active region. Flanks of the ridge waveguides can each be covered by a passivation layer having a refractive index different from a refractive index of the semiconductor layer sequence.

In plan view, the emitter regions do not overlap to a large extent with the active zones in the lateral direction. For example, the emitter regions each overlap with an active zone by at most 10% in the lateral direction in plan view. Preferably, the emitter regions do not overlap with the active zone. In this case, the emitter regions are preferably directly adjacent to the active zones in the lateral direction in plan view.

An idea of the radiation emitting semiconductor chip described herein is, inter alia, that the radiation emitting semiconductor chip has a plurality of active regions which do not extend parallel to grid lines of a regular grid on which the emitter regions are arranged. Thus, such a semiconductor chip advantageously has a particularly high density of emitter regions per unit area.

Furthermore, the dimensions of the active zones are predetermined by the dimensions of the first contact layers and the second contact layers, respectively. Thus, there is no need for costly etching of the semiconductor layer sequence. Advantageously, non-radiative recombination of charge carriers, which can occur for example on etched side surfaces of a semiconductor layer sequence, are reduced. Thus, the efficiency of the radiation emitting semiconductor chip is particularly good.

According to one embodiment, the radiation emitting semiconductor chip is a superluminescent light-emitting diode with an increased brightness and/or an increased luminous flux compared to a conventional light-emitting diode. The generated electromagnetic radiation of the superluminescent light-emitting diode (in short "SLED") can be amplified in the active region. For example, electromagnetic radiation propagating towards the second reflective surface can be directed towards the first reflective surface. Emitted electromagnetic radiation propagating towards the first reflective surface can advantageously be superimposed on the reflected electromagnetic radiation coming from the second reflective surface. The coupled electromagnetic radiation is thus amplified and has an increased brightness and/or luminous flux.

In contrast to a laser diode, superluminescent light-emitting diodes usually do not have a resonator. In connection with the superluminescent light-emitting diode, electromagnetic radiation is advantageously amplified, with the radiation having comparatively low temporal coherence and comparatively high spatial coherence. Thus, the superluminescent light-emitting diode has a broader emission spectrum compared to a laser diode. Advantageously, light granulation (speckle noise) can be reduced by the comparatively broad emission spectrum.

The electromagnetic radiation preferably propagates in the active zone and in the active region along the main extension direction and is directed onto the first reflective surface and coupled out via the emitter region. Thus, the coupled out radiation advantageously exhibits a directional emission direction.

The radiation emitting semiconductor chip described herein can preferably form a display or be used as a radiation source in a display. Further, the radiation emitting semiconductor chip described herein is preferably suitable for near-to-eye applications.

Furthermore, the radiation emitting semiconductor chip described herein can be usable for applications in which a high, for example monochromatic, luminance is required on a predetermined area. In this case, the radiation emitting semiconductor chip can be used as a light source in a projector or beamer. In this case, the active regions are usually not individually controllable.

According to one embodiment, the radiation emitting semiconductor chip is a laser diode. In this case, the radiation emitting semiconductor chip is configured to emit laser radiation. Preferably, the laser radiation is emitted via the emitter region. The emitted laser radiation preferably has a comparatively large temporal coherence and a comparatively large spatial coherence. In this case, the laser radiation is coherent radiation. The radiation emitted by the active region is in this case preferably monochromatic and coherent laser light. The radiation thus advantageously has a comparatively low bandwidth with a simultaneous comparatively high luminous flux.

By means of a portion of the electromagnetic radiation reflected at the anti-reflective coating, the radiation emitting semiconductor chip can be converted from a superluminescent light-emitting diode to a laser diode.

According to one embodiment of the radiation emitting semiconductor chip, the active regions are arranged as an array. Arranging the active regions as an array means, for example, that the active regions are arranged at the grid points of the one-dimensional grid or at the grid points of the two-dimensional grid.

Furthermore, embodiments provide a radiation emitting semiconductor device comprising a radiation emitting semiconductor chip described herein. Any features and embodiments disclosed in connection with the radiation emitting semiconductor chip can therefore also be formed in connection with the radiation emitting semiconductor device and vice versa.

According to at least one embodiment, the radiation emitting semiconductor device comprises a first radiation emitting semiconductor chip formed by a radiation emitting semiconductor chip described herein.

According to at least one embodiment, the radiation emitting semiconductor device comprises at least one further radiation emitting semiconductor chip.

According to at least one embodiment, the first radiation emitting semiconductor chip is configured to emit electromagnetic radiation of a first wavelength range. Preferably, the electromagnetic radiation is light of blue, green or red colour. Preferably, the first wavelength range is between 400 nanometres and 490 nanometres inclusive, between 490 nanometres and 600 nanometres inclusive, or between 600 nanometres and 700 nanometres inclusive.

According to at least one embodiment, the second radiation emitting semiconductor chip is configured to emit electromagnetic radiation of a second wavelength range. Preferably, the second wavelength range is between 400 nanometres and 490 nanometres inclusive, between 490 nanometres and 600 nanometres inclusive, or between 600 nanometres and 700 nanometres inclusive.

Preferably, the electromagnetic radiation of the first wavelength range is different from the electromagnetic radiation of the second wavelength range.

According to at least one embodiment, the second radiation emitting semiconductor chip is a radiation emitting semiconductor chip described herein.

According to at least one embodiment, the first radiation emitting semiconductor chip and the second radiation emitting semiconductor chip are arranged side by side. Preferably, side surfaces of the first radiation emitting semiconductor chip and the second radiation emitting semiconductor chip are directly adjacent to one another. Further, the top surfaces and the bottom surfaces of the first radiation emitting semiconductor chip and the second radiation emitting semiconductor chip can each be arranged in a common plane.

Further, it is possible that the radiation emitting semiconductor device comprises a third radiation emitting semiconductor chip formed by a radiation emitting semiconductor chip described herein. The third radiation emitting semiconductor chip is preferably configured to emit electromagnetic radiation of a third wavelength range. The third wavelength range is preferably between 400 nanometres and 490 nanometres inclusive, between 490 nanometres and 600 nanometres inclusive, or between 600 nanometres and 700 nanometres inclusive.

Preferably, the electromagnetic radiation of the first wavelength region is different from the electromagnetic radiation of the second wavelength region and the third wavelength region.

Preferably, side surfaces of the second radiation emitting semiconductor chip and the third radiation emitting semiconductor chip are directly adjacent to one another. Further, the top surfaces and the bottom surfaces of the second radiation emitting semiconductor chip and the third radiation emitting semiconductor chip can each be arranged in a common plane.

For example, the first radiation emitting semiconductor chip can be configured to emit electromagnetic radiation of red colour, the second radiation emitting semiconductor chip can be configured to emit electromagnetic radiation of green colour, and the third radiation emitting semiconductor chip can be configured to emit electromagnetic radiation of blue colour. The first radiation emitting semiconductor chip, the second radiation emitting semiconductor chip and the third radiation emitting semiconductor chip can preferably be arranged adjacent to one another.

Further, the radiation emitting semiconductor device can comprise a plurality of first radiation emitting semiconductor chips, a plurality of second radiation emitting semiconductor chips, and a plurality of third radiation emitting semiconductor chips. The first, second and third semiconductor chips can be arranged alternately side by side.

Alternatively, the second radiation emitting semiconductor chips are arranged on the first radiation emitting semiconductor chip. Preferably, the second radiation emitting semiconductor chips are arranged on a top surface of the first radiation emitting semiconductor chip. In this case, the emitter regions of the first radiation emitting semiconductor chip and the emitter regions of the second radiation emitting semiconductor chip can overlap in plan view. In this case, the emitter regions of the second radiation emitting semiconductor chip are preferably arranged downstream of the emitter regions of the first radiation emitting semiconductor chip in the vertical direction.

According to at least one embodiment, the radiation emitting semiconductor device comprises a plurality of second radiation emitting semiconductor chips. The second radiation emitting semiconductor chips are preferably light-emitting diode chips, in short LED chips.

According to at least one embodiment, the second radiation emitting semiconductor chips are arranged on the first radiation emitting semiconductor chip. Preferably, the second radiation emitting semiconductor chips are arranged on a top surface of the first radiation emitting semiconductor chip. Particularly preferably, the second radiation emitting semiconductor chips can also be arranged on the emitter regions, among others. In this case, the first radiation emitting semiconductor chip is configured to emit light of red colour and the second radiation emitting semiconductor chips are adapted to emit light of blue or green colour. Preferably, the light from the first semiconductor chip can pass through the second radiation emitting semiconductor chips substantially undisturbed.

BRIEF DESCRIPTION OF THE DRAWINGS

Hereinafter, the radiation emitting semiconductor chip and the radiation emitting semiconductor device is explained in more detail with reference to the Figures with reference to exemplary embodiments.

DETAILED DESCRIPTION OF ILLUSTRATIVE EMBODIMENTS

Elements that are identical, similar or similar acting are given the same reference signs in the Figures. The Figures and the proportions of the elements shown in the Figures are not to be regarded as true to scale. Rather, individual elements can be shown exaggeratedly large for better representability and/or for better comprehensibility.

Figure 1:
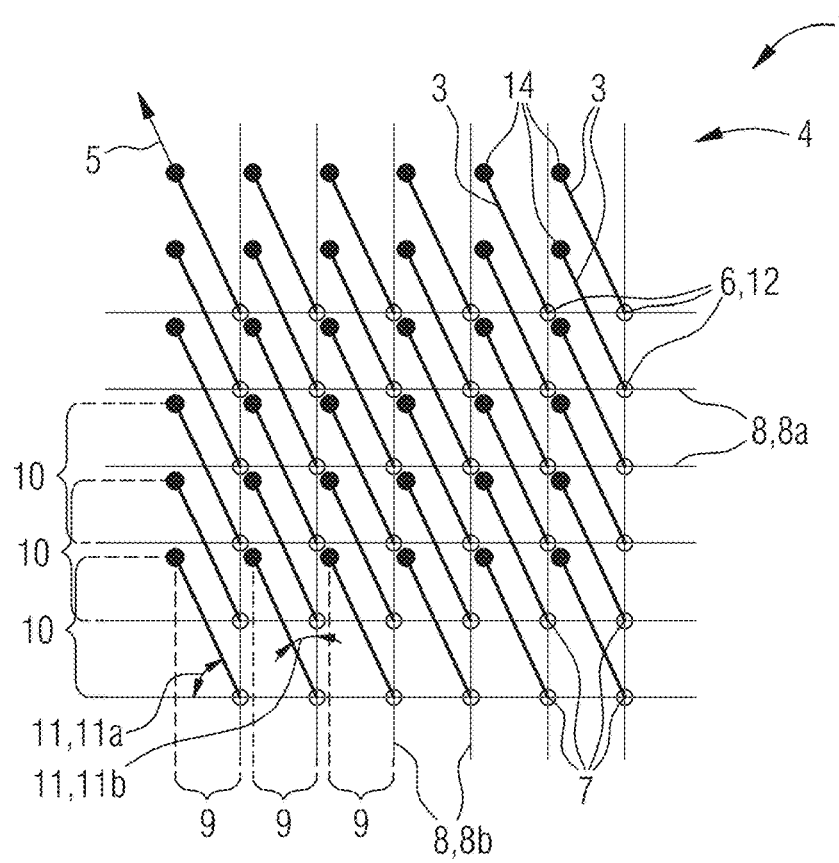
FIG. 1 a schematic representation in plan view of a radiation emitting semiconductor chip according to an exemplary embodiment.

The schematic diagram of FIG. 1 shows an exemplary embodiment of a radiation emitting semiconductor chip 1 described herein, which comprises a semiconductor layer sequence 2 with a plurality of active regions 3 and a main extension plane 1.

The active regions 3 are spaced apart from one another in lateral direction and are not in direct contact with one another at any point. Each active region 3 has a main extension direction 5, each extending along a length of an active region 3.

The width in lateral direction of the active regions 3 in this exemplary embodiment is for example 5 micrometres. The length of the active regions 3 in the lateral direction is here, for example, 100 micrometres.

During operation, each active region 3 emits electromagnetic radiation from an emitter region 6 extending parallel to the main extension plane 4. The emitter regions 6 are each arranged along a main extension direction 5 in a first edge region 12 of an active region 3. A second edge region 14 is arranged opposite the first edge regions 12 in each case. The first edge regions 12 are marked with a white circle in FIG. 1, while the second edge regions 14 are marked with a black circle in FIG. 1.

The emitter regions 6 are arranged at grid points 7 of a regular grid, which are connected by at least one grid line 8. According to this exemplary embodiment, the regular grid is an orthogonal, two-dimensional grid. The regular grid here has first grid lines 8a and second grid lines 8b. The first grid lines 8a are orthogonal to the second grid lines 8b.

The main extension directions 5 of the active regions 3 here each have a first angle 11a of approximately 65° with the first grid lines 8a. According to this exemplary embodiment, the main extension directions 5 of the active regions 3 each enclose a second angle 11b of approximately 25° with the second grid lines 8b. The first angle 8a and the second angle 8b thus add up to approximately 90°.

The emitter regions 6 are thus arranged along columns 9 and rows 10. The rows 10 extend along the first grid lines 8a. The columns 9 extend along the second grid lines 8b.

The main extension directions 5 of the active regions 3 of each row 10 include the same first angles 11a with the first grid lines 8a of the regular grid. Thus, the main extension directions 5 of the active regions 3 in each column 9 also enclose equal second angles 11b with the second grid lines 8b of the regular grid. That is to say that all the main extension directions 5 of the active regions 3 are parallel to one another.

In a side view along the rows 10, the active regions 3 of a row 10 are formed completely overlapping. Furthermore, the active regions 3 of directly adjacent rows 10 partially overlap in a side view along the rows 10. Furthermore, the active regions 3 of a column 9 are completely overlapping in a side view along the columns 9. The active regions 3 of directly adjacent columns 9 do not overlap in a side view along the columns 9.

The second edge regions 14 are arranged at further grid points of a further regular grid. The further regular grid is displaced relative to the regular grid by a translation vector. That is to say that without a translation vector, the regular grid and the further regular grid are congruent.

Figure 2:
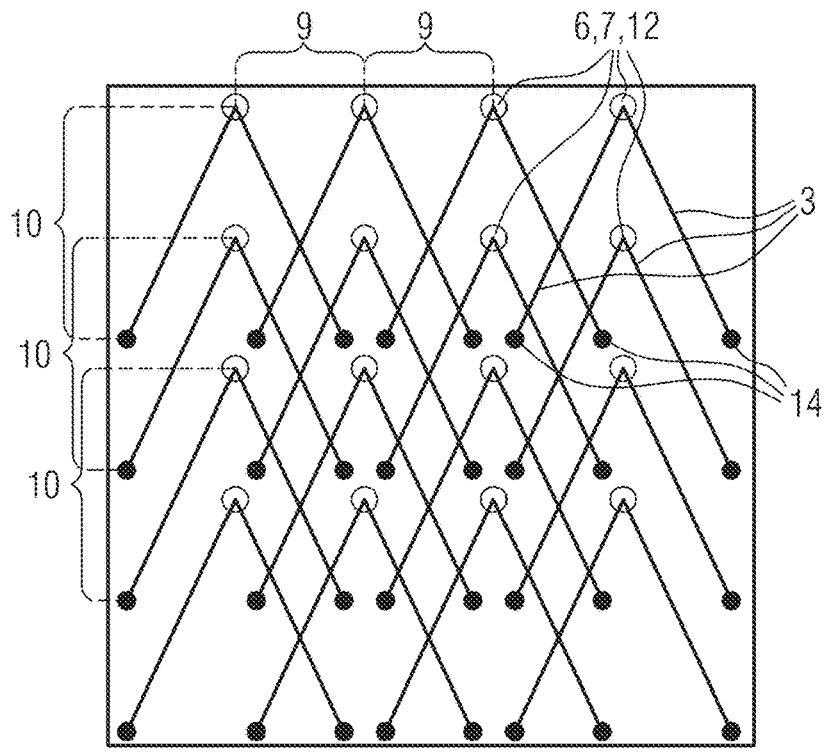
FIG. 2 a schematic representation in plan view of a radiation emitting semiconductor chip according to an exemplary embodiment.

According to FIG. 2, an embodiment of a radiation emitting semiconductor chip 1 described here is shown, in which active regions 3 overlap with one another in plan view. Here, directly adjacent active regions 3 of a common row 10 overlap with an active region 3 of a directly adjacent column 9. The regions overlapping in plan view each form a common active region.

Furthermore, two first regions 12 of each of two directly adjacent emitter regions 6 in a row 10 overlap in plan view. Here, the two directly adjacent emitter regions 6 completely overlap with one another and form a common emitter region.

The common emitter regions are arranged at grid points 7 of a regular grid, which are connected by at least one grid line 8. Here, the regular grid is an orthogonal grid, analogous to the exemplary embodiment according to FIG. 1.

In contrast to the exemplary embodiment of FIG. 1, the second edge regions 14 are arranged at further grid points of a further regular grid which cannot be aligned congruently with the regular grid.

Alternatively, according to FIG. 2, a radiation emitting device comprising a first radiation emitting semiconductor chip and a second radiation emitting semiconductor chip can be described. The second radiation emitting semiconductor chips are arranged on the first radiation emitting semiconductor chip, for example. The first radiation emitting semiconductor chip is arranged downstream of the second radiation emitting semiconductor chip in this case. The emitter regions of the first radiation emitting semiconductor chip and the emitter regions of the second radiation emitting semiconductor chip overlap here in plan view.

Figure 3:
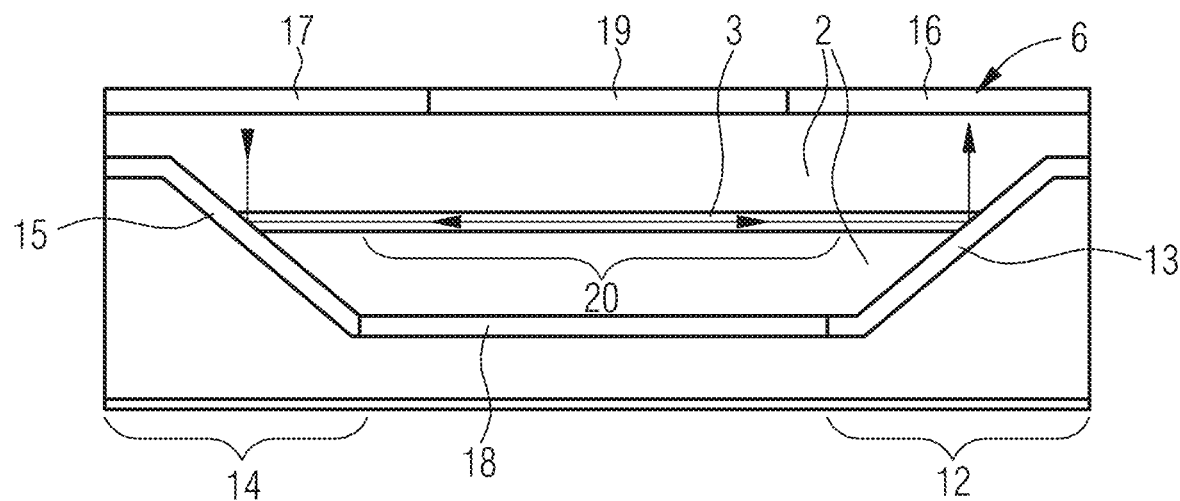
FIG. 3 a schematic sectional view of a radiation emitting semiconductor chip according to an exemplary embodiment.

In the schematic sectional view of FIG. 3, an exemplary embodiment of an active region 3 is shown along a main extension direction of a radiation emitting semiconductor chip 1 described herein, which has a semiconductor layer sequence 2 comprising the active region 3.

A first reflective surface 13 is arranged in a first edge region 12, wherein an angle between the first reflective surface 13 and the main extension plane is approximately 45°. Furthermore, an anti-reflective coating 16 is arranged on the top surface of the semiconducting layer sequence 2 in the first edge region 12.

A second reflective surface 15 is arranged in a second edge region 14, wherein an angle between the second reflective surface 15 and the main extension plane is approximately 45°. Furthermore, a reflective coating 17 is arranged on the top surface of the semiconducting layer sequence 2 in the second edge region 14.

Between the anti-reflective coating 16 and the reflective coating 17, a second contact layer 19 is arranged on the top surface of the semiconductor layer sequence 2 along the main extension direction 5. A first contact layer 18 is arranged on the opposite bottom surface of the semiconductor layer sequence 2 along the main extension direction 5. The first contact layer 18 and the second contact layer 19 predetermine the lateral dimension of an active zone 20 of the active region 3.

According to the arrows shown in FIG. 3, directions of propagation of electromagnetic radiation are depicted. The electromagnetic radiation generated in the active zone 20 forms in each case a beam with a beam profile which, in cross-section perpendicular to a main extension direction 5 of the active region 3, has a lateral and a vertical extension. Electromagnetic radiation propagating in the direction of the second reflective surface 15 is directed towards the first reflective surface 13 by means of the reflective coating 17 and further reflection at the second reflective surface 15. Emitted electromagnetic radiation propagating in the direction of the first reflective surface 13 is superimposed on the radiation reflected at the second reflective surface 15. The electromagnetic radiation of the active zone 20 superimposed in this way is superimposed in the area of the anti-reflective coating 16 and is coupled out. The coupled out radiation is thus amplified and has an increased brightness and an increased luminous flux.

Figure 4:
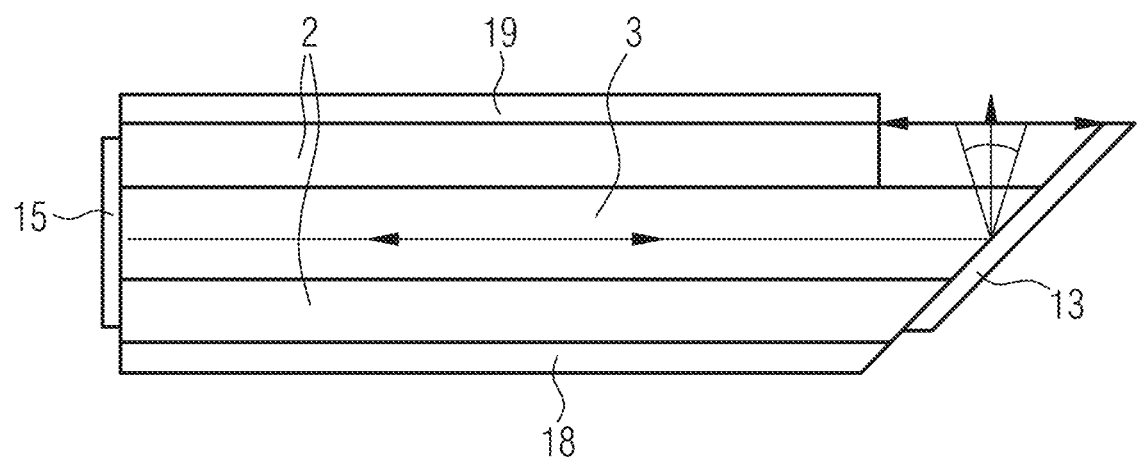
FIG. 4 a schematic sectional view of a radiation emitting semiconductor chip according to an exemplary embodiment.

In contrast to the exemplary embodiment in connection with FIG. 3, the active region 3 according to FIG. 4 does not have a reflective coating 17. Furthermore, a second reflective surface 15 is arranged perpendicular to the main extension plane 4. Thus, electromagnetic radiation propagating in the direction of the second reflective surface 15 is directed directly at the second reflective surface 15 in the direction of the first reflective surface 13. The beam profile of the coupled out electromagnetic radiation has, for example, an aperture angle which is predetermined by a material system of the semiconductor chip 1 used. When an AlGaN material system is used, the aperture angle is usually about 34°.

In this exemplary embodiment, no anti-reflective coating 16 is arranged on the top surface of the semiconductor layer sequence 2.

The radiation emitting semiconductor chip 1 according to the exemplary embodiments of FIGS. 1, 2, 3 and 4 is configured in each case as a superluminescent light-emitting diode.

Figure 5:
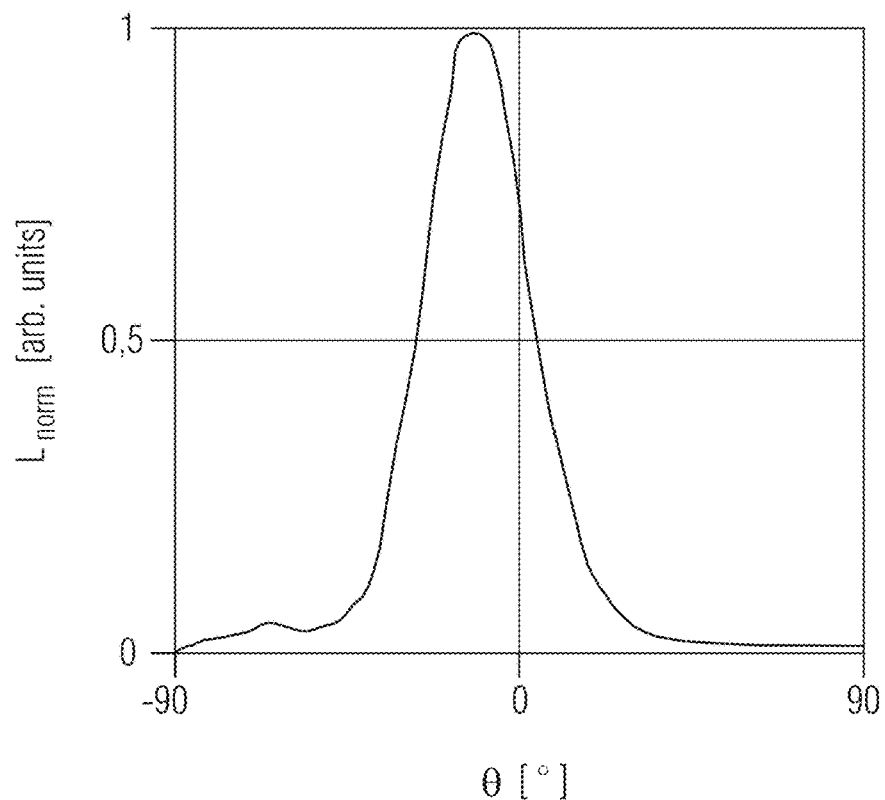
FIG. 5 exemplary measurements of the far field of electromagnetic radiation of a radiation emitting semiconductor chip according to an exemplary embodiment.

In FIG. 5, a measurement of the far field of electromagnetic radiation of a single active region of a semiconductor radiation emitting chip described herein is plotted in a diagram, in which a normalised radiant power $L_{norm}$ of the radiation is plotted in arbitrary units versus polar coordinates θ in degrees [°]. The measured radiant power of the radiation in the far field is here produced by a single active region.

Preferably, the radiation in a far field has a fast axis and a slow axis. In the far field, the radiation propagates as a plane wave in space. The direction of oscillation of the radiation in which the plane wave has the greater propagation speed is called the "fast axis", the direction of oscillation which is perpendicular to the fast axis and has a smaller propagation speed is called the "slow axis".

The normalised radiant power $L_{norm}$ is measured along a fast axis and has a full width half maximum (FWHM) of, for example, 32°.

Figure 6:
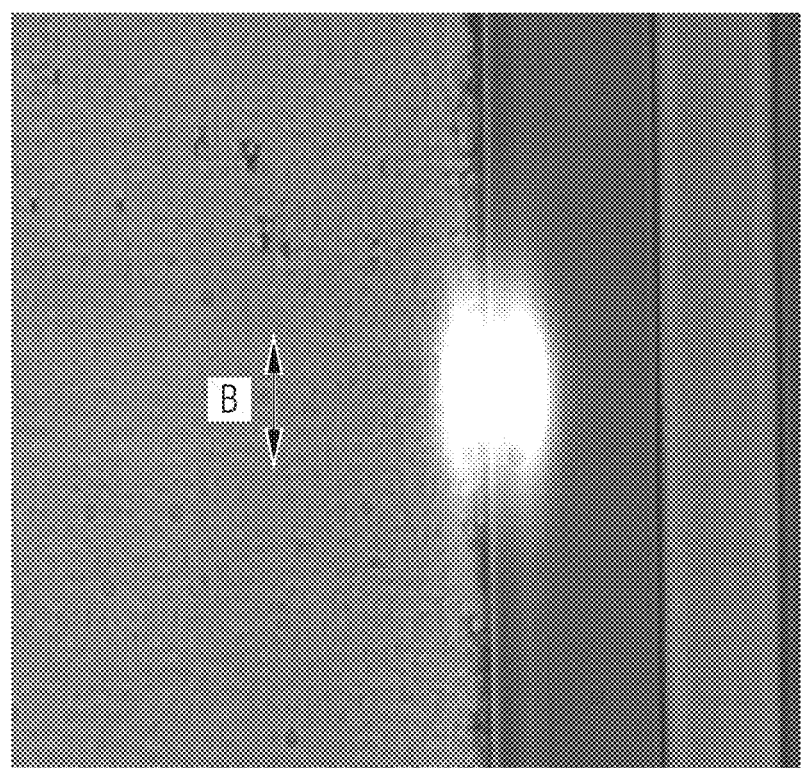
FIG. 6 exemplary top view infrared microscope image of an emitter region of an IR radiation emitting semiconductor chip.

FIG. 6 shows a top view of a radiation emitting semiconductor chip in the region of a single emitter region. By means of the width B of the first contact, the slow axis can be predetermined.

The invention is not limited to the exemplary embodiments by the description based thereon. Rather, the invention encompasses any new feature as well as any combination of features, which in particular includes any combination of features in the claims, even if this feature or combination itself is not explicitly indicated in the claims or embodiments.

The invention claimed is:

1. A radiation emitting semiconductor chip comprising:
   a semiconductor layer sequence with a plurality of active regions and a main extension plane,
   wherein each active region has a main extension direction,
   wherein each active region is configured to emit electromagnetic radiation from an emitter region extending parallel to the main extension plane,
   wherein at least two active regions overlap in plan view,
   wherein the emitter regions are arranged at grid points of a regular grid connected by at least one grid line, and
   wherein the main extension direction of at least one active region encloses an angle of at least 10° and at most 80° with the grid lines of the regular grid.

2. The radiation emitting semiconductor chip according to claim 1, wherein the emitter regions are arranged along columns and rows.

3. The radiation emitting semiconductor chip according to claim 2, wherein the main extension directions of the active regions in at least one row enclose equal angles with the grid lines of the regular grid.

4. The radiation emitting semiconductor chip according to claim 2, wherein the main extension directions of the active regions of different rows include different angles with the grid lines of the regular grid.

5. The radiation emitting semiconductor chip according to claim 2, wherein the main extension directions of the active regions in at least one row enclose different angles with the grid lines of the regular grid.

6. The radiation emitting semiconductor chip according to claim 1, wherein a first reflective surface is arranged in a first edge region of each active region, the first reflective surface enclosing an angle of at least 35° and at most 55° with the main extension plane.

7. The radiation emitting semiconductor chip according to claim 6, wherein the first edge regions of at least two directly adjacent emitter regions in a row overlap in plan view.

8. The radiation emitting semiconductor chip according to claim 6, wherein a second reflective surface is arranged in a second edge region of each active region opposite the first edge region.

9. The radiation emitting semiconductor chip according to claim 8, wherein the second reflective surface encloses an angle of at least 35° and at most 55° with the main extension plane.

10. The radiation emitting semiconductor chip according to claim 8, wherein the second reflective surfaces are each perpendicular to the main extension plane.

11. The radiation emitting semiconductor chip according to claim 1,
    wherein each active region comprises an anti-reflective coating arranged on the semiconductor layer sequence in a first edge region, and
    wherein each active region has a reflective coating arranged on the semiconductor layer sequence in a second edge region.

12. The radiation emitting semiconductor chip according to claim 1,
    wherein each active region comprises a first contact layer arranged on a top surface of the semiconductor layer sequence,
    wherein each active region comprises a second contact layer arranged on a bottom surface of the semiconductor layer sequence, and
    wherein the first contact layers and the second contact layers predetermine lateral dimensions of an active zone of each active region.

13. The radiation emitting semiconductor chip according to claim 1, wherein the radiation emitting semiconductor chip is a superluminescent light emitting diode having an increased brightness and/or an increased luminous flux compared to a conventional light emitting diode.

14. The radiation emitting semiconductor chip according to claim 1, wherein the radiation emitting semiconductor chip is a laser diode.

15. The radiation emitting semiconductor chip according to claim 13, wherein the active regions are arranged as an array.

16. A radiation emitting semiconductor device comprising:
   a first radiation emitting semiconductor chip according to claim 1; and
   at least one second radiation emitting semiconductor chip according to claim 1,
   wherein the first radiation emitting semiconductor chip is configured to emit electromagnetic radiation of a first wavelength range, and
   wherein the second semiconductor radiation emitting chip is configured to emit electromagnetic radiation of a second wavelength range.

17. The radiation emitting semiconductor device according to claim 16,
   wherein the first radiation emitting semiconductor chip and the second radiation emitting semiconductor chip are arranged side by side.

18. The radiation emitting semiconductor device according to claim 16, further comprising a plurality of second radiation emitting semiconductor chips, wherein the second radiation emitting semiconductor chips are arranged on the first radiation emitting semiconductor chip.

19. A radiation emitting semiconductor chip comprising:
   a semiconductor layer sequence with a plurality of active regions and a main extension plane,
   wherein each active region has a main extension direction,
   wherein each active region is configured to emit electromagnetic radiation from an emitter region extending parallel to the main extension plane,
   wherein the emitter regions are arranged at grid points of a regular grid connected by at least one grid line,
   wherein the main extension direction of at least one active region encloses an angle of at least 10° and at most 80° with the grid lines of the regular grid,
   wherein a first reflective surface is arranged in a first edge region of each active region,
   wherein the first reflective surface encloses an angle of at least 35° and at most 55° with the main extension plane,
   wherein a second reflective surface is arranged in a second edge region of each active region opposite the first edge region, and
   wherein the second reflective surface encloses an angle of at least 35° and at most 55° with the main extension plane.

* * * * *